United States Patent [19]
Mankin et al.

[11] Patent Number: 5,625,567
[45] Date of Patent: Apr. 29, 1997

[54] ELECTRONIC CIRCUIT DESIGN SYSTEM AND METHOD WITH PROGRAMMABLE ADDITION AND MANIPULATION OF LOGIC ELEMENTS SURROUNDING TERMINALS

[75] Inventors: Richard A. Mankin, Medway; David L. Allen, Maynard; Prasanna P. Deshmukh, Northboro, all of Mass.

[73] Assignee: Viewlogic Systems, Inc., Marlboro, Mass.

[21] Appl. No.: 151,565

[22] Filed: Nov. 12, 1993

[51] Int. Cl.$^6$ .................................................. G06F 17/50
[52] U.S. Cl. ........................ 364/490; 364/488; 364/491
[58] Field of Search ................................. 364/488–491; 326/38, 39, 40, 41, 47

[56] References Cited

U.S. PATENT DOCUMENTS

| | | | |
|---|---|---|---|
| 4,683,384 | 7/1987 | Shibata et al. | 307/475 |
| 4,689,502 | 8/1987 | Shimauchi et al. | 307/443 |
| 4,703,435 | 10/1987 | Darringer et al. | 364/489 |
| 5,036,473 | 7/1991 | Butts et al. | 364/489 |
| 5,281,558 | 1/1994 | Bamji et al. | 437/250 |
| 5,292,687 | 3/1994 | Isozaki | 437/209 |
| 5,317,698 | 5/1994 | Chan | 395/325 |
| 5,341,308 | 8/1994 | Mendel | 364/489 |
| 5,404,310 | 4/1995 | Mitsuhashi | 364/490 |
| 5,448,493 | 9/1995 | Topolewski et al. | 364/489 |
| 5,452,226 | 9/1995 | Hooper et al. | 364/489 |
| 5,452,231 | 9/1995 | Butts et al. | 364/489 |

*Primary Examiner*—Kevin J. Teska
*Assistant Examiner*—Leigh Marie Garbowski
*Attorney, Agent, or Firm*—Hale and Dorr

[57] ABSTRACT

A system and method for programmatically adding pads and ports and altering design logic at the terminals of electronic circuit designs is provided. In a preferred embodiment the system and method are implemented within a system that partitions arbitrary designs but the system and method may be used by itself to add terminal logic. Patterns and connections of removable logic of the internal circuitry can be specified by a user or by system default settings stored in an external file.

10 Claims, 15 Drawing Sheets

ELECTRONIC CIRCUIT DESIGN SYSTEM
AND METHOD WITH PROGRAMMABLE
ADDITION AND MANIPULATION OF LOGIC
ELEMENTS SURROUNDING TERMINALS

BACKGROUND OF THE INVENTION

The present invention relates to a system and method for creating electronic circuit designs and in particular to a system and method for programmatically adding and manipulating logic elements surrounding terminals to create new designs or modify existing designs of electronic circuits.

In recent years, use of software tools to design electronic circuits has increased dramatically. Prior to designing an ASIC (Application Specific Integrated Circuit) or a programmable FPGA (Field Programmable Gate Array) it is necessary to add specific pads, ports and possibly logic at tristate outputs to terminals of each design.

Referring to FIG. 1 an electronic circuit 10 is shown, which circuit is either a fixed ASIC or a programmable FPGA design. The circuit has a finite size, with a portion of the surface area of the circuit being dedicated to internal circuits 12 which perform the functions of the chip. The remainder of the chip is dedicated to pads 14 or ports 16.

As shown in FIG. 1 on an FPGA chip, there is an inner rectangular array of logic 13, surrounded by an outer (rectangular) ring of logic 15. Each identical element 14 of the outer ring of logic is referred to as a "pad". These pads are used for a number of standard functions including but not limited to controlling outside loads, buffering and providing surge protection. When a "device" is mounted into a "package" some, but perhaps not all, of the "pads" are connected to the physical package pins or "ports" 16. When a designer captures a schematic, he places symbols for "pad" logic, and also indicates which of the "pad" cells must be connected to physical package pins. This indication is made by attaching "port" symbols to most or all of the "pad" symbols.

With most chip designs, the chip designer desires to maximize the circuitry on the chip to perform as many functions for the chip as possible. Because the chips have a fixed size, the number of internal circuits 12 is limited by the dimensions of the available chip surface assigned to the internal circuits 12. In many cases, however, while the circuit 10 contains the maximum internal circuitry 12, the pads 14 and ports 16 often contain unused circuitry or are entirely unused when automatic circuit generating tools are used. FIG. 2 shows a circuit design 19 before pads and ports are added and FIG. 3 shows a circuit design in which input ports 20, input pads 22, output pads 24 and output ports 26 have been added automatically without any logic being mapped to the pads.

The particular pads and ports in any circuit depend on the particular circuit technology (i.e., family of chips) being used. All of these pads and ports are utilized to interface either with other circuits or with other parts of the system in which the circuit is a component. These pads and ports enable technology-specific back end placement and routing tools to function. The added ports indicate the direction of signal flow through the terminals. The added pads corresponding to physical pads on the target chip and indicate signal flow direction. Pads may also contain logic in addition to the logic needed to perform the standard pad functions described above. If such extra logic available within such pads can be utilized, the resources on the chip will be capable of performing more functions which may result in fewer overall devices on the board.

Another goal of any circuit design is to minimize the number of pads and ports that are utilized so that more functions that require pads and ports can be provided on the device. In the case where tristate outputs are wired together, existing automatic design tools add one pad and one port for each tristate output in the circuit which often results in the utilization of a significant number of available pads and ports on the device. If the number of pads and ports required to be assigned to tristate outputs can be reduced, the device will be able to perform additional functions.

In the past, pads and ports were provided either explicitly by the designer or inefficiently added in an unconfigurable manner which failed to fully utilize available chip resources. This was a tedious process and was only possible because the designer was familiar with the design that was being presented to back end tools. Now that circuit design tools enable complex structural designs to be explicitly created and since such complex structural designs may also be created through synthesis from high level behavioral languages like VHDL, it is much more difficult for a designer to add the appropriate pads and ports and reduce the number of pads and ports required for tristate outputs because the circuit may be designed on a high-level conceptual basis.

To make this process easier, designers will often use a tool commonly called a "partitioner" which breaks an original chip design into subdesigns each of which observe the characteristics of the target technology which will sometimes be used for prototyping. Because the design output is now generally software derived, the manual addition of pads and ports and attempts to minimize pads and ports is even more tedious and more difficult as the designer is often unfamiliar with the specific characteristics and available resources on each targeted chip. To date, there are no systems which will automatically add configurable pads and ports in an optimized manner and reduce pads and ports required for tristate outputs wired together. Further complicating this problem is that it is difficult to ensure that net names at terminals are preserved, especially in the case of bidirectional terminals. This is important because terminals are recognized in devices by their net name.

It is therefore a principal object of the present invention to provide a system and method for programmatically adding and manipulating logic at terminals of electronic circuits.

It is the further object of the present invention to provide a system and method for automatically adding pads and ports to generate electronic circuit designs in a manner which will maximize the resources of the designed circuit.

Another object of the present invention is to provide a system and method for automatically reducing the pads and ports required for tristate outputs wired together.

Still another object of the present invention is to provide a system and method for adding and manipulating logic at terminals of electronic circuits which maintains the net names at the terminals where such pads and ports are automatically added.

SUMMARY OF THE INVENTION

Accordingly, a system and method for programmatically adding pads and ports and altering design logic at the terminals of electronic circuit designs is provided. In a preferred embodiment the system and method are implemented within a system that partitions arbitrary designs but the system and method may be used by itself to add terminal logic.

The system and method of the present invention start with required information concerning a target technology and package which is specified by the designer. Package characteristics such as the number of available combinational and sequential logic gates, available terminals and number of clocks per package are set when a package and technology are specified. After the technology and package are specified, then a gate level, retargeted, synthesized, previously partitioned or other design net list is input into the system.

If the designer elects to perform partitioning, the designer may interactively or automatically read in a design and partition such design until the design fits into a desired number of partitions where each partition corresponds to a physical package. Specified constraints and rules are used by the system to guide the clustering techniques which determine how to best combine partitions to ensure that characteristics like device capacity are not exceeded. The system also utilizes certain constraints and rules to put more logic into pads and to add appropriate logic when resolving tristate and bidirectional logic. When the designer does not have a design which spans multiple devices and does not require partitioning, logic at the pads can simply be added to the design.

The system produces a design including one or more partitions which need to be written to disk for use by schematic generators or by vendor specific back end place and route tools. These new partitions are written out with a top level design which instantiates all of the new partitions with a net list being provided for the top level design and for each underlying partition.

Prior to the actual writing of the partitions, the system and method perform the following operations. First, the system determines the terminal type of each terminal (i.e. input, output, tristate or bidirectional). Then, for each terminal that is connected to tristate outputs, one or more new logic gates, which will be referred to herein as "tri enable gates", are connected to the tri enable input of a tristate pad.

Patterns and connections of removable logic of the internal circuitry can be specified by a user or by system default settings stored in an external file. Each recognized pattern and its connections in an internal circuit are tagged to be deleted. Each unique instance of a specified destination component is added and tagged as added and the new component is connected to nets as guided by the specific information in a technology file for the type of technology being used. The design can then be written out along with the ports for each terminal. When the design is written, the components tagged as deleted will not be written out while the components tagged as added will be written out. For those terminals where no pattern was recognized, simple pads and ports that contain no additional logic are written out.

An important feature of the present invention is that the system preserves the net names at all terminals including bidirectionals so that they may be recognized and used by other parts of the system. In other words, when newly created logic is added to the pads of each circuit design, the system and method insure that the output of this logic has the original name and that the inner nets connecting to the new gates are assigned new net names.

These and other objects and features of the present invention will be more fully understood from the following detailed description which should be read in light of the accompanying drawings, in which corresponding reference numerals refer to corresponding parts throughout the several views.

BRIEF DESCRIPTION OF THE DRAWINGS

Appendix A is a listing of examples of mapping instructions stored in a technology file used by the system and method of the present invention.

DETAILED DESCRIPTION OF THE PREFERRED EMBODIMENTS

Figure 1:
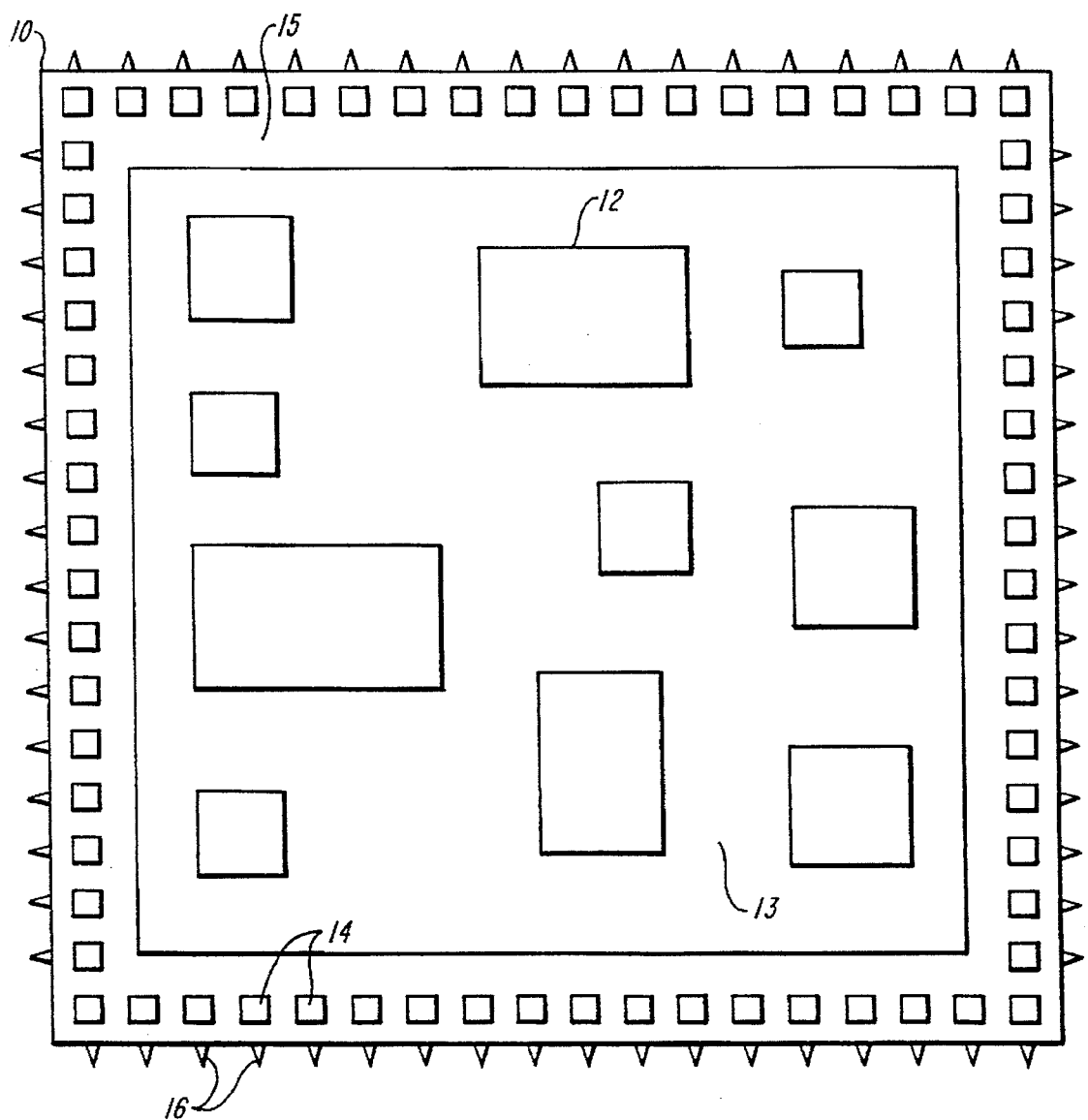
FIG. 1 is a top plan view of a diagrammatic view of an electronic circuit with pads and ports.
Figure 2:
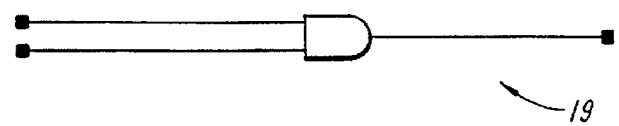
FIG. 2 is a schematic diagram of a simple electronic circuit to which pads and ports will be added.
Figure 3:
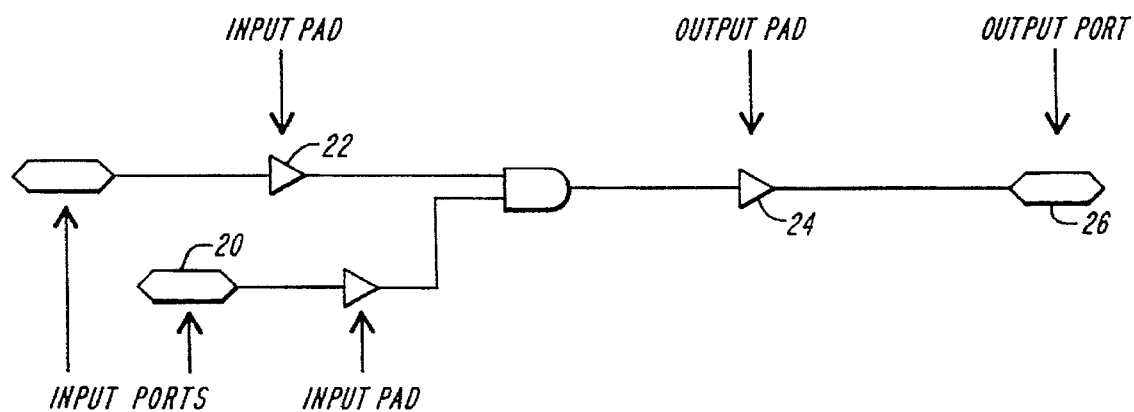
FIG. 3 is a schematic diagram of the electronic circuit shown in FIG. 2 in which pads and ports have been added.
Figure 4:
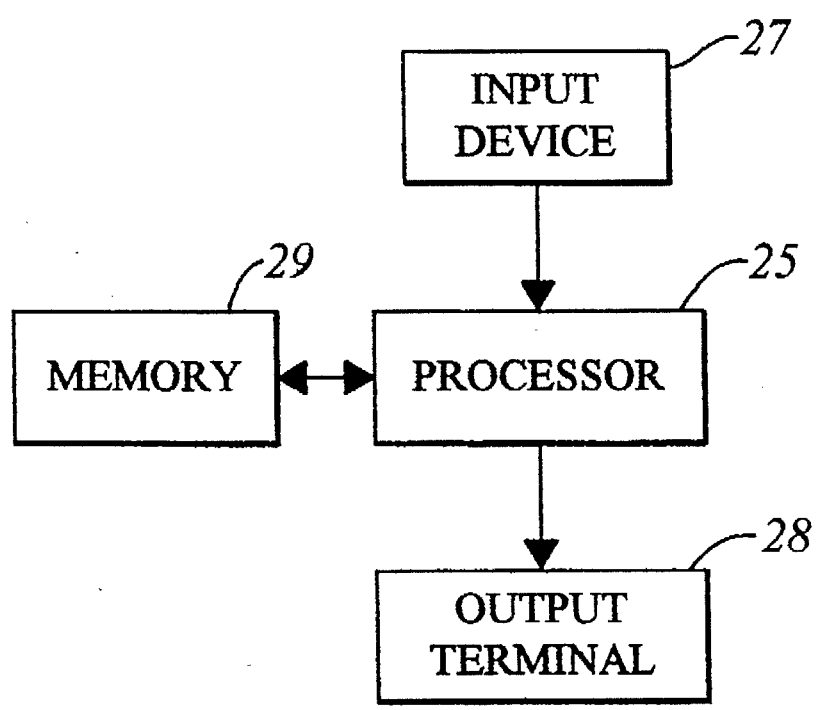
FIG. 4 is a block diagram of the system of the present invention.
Figure 5:
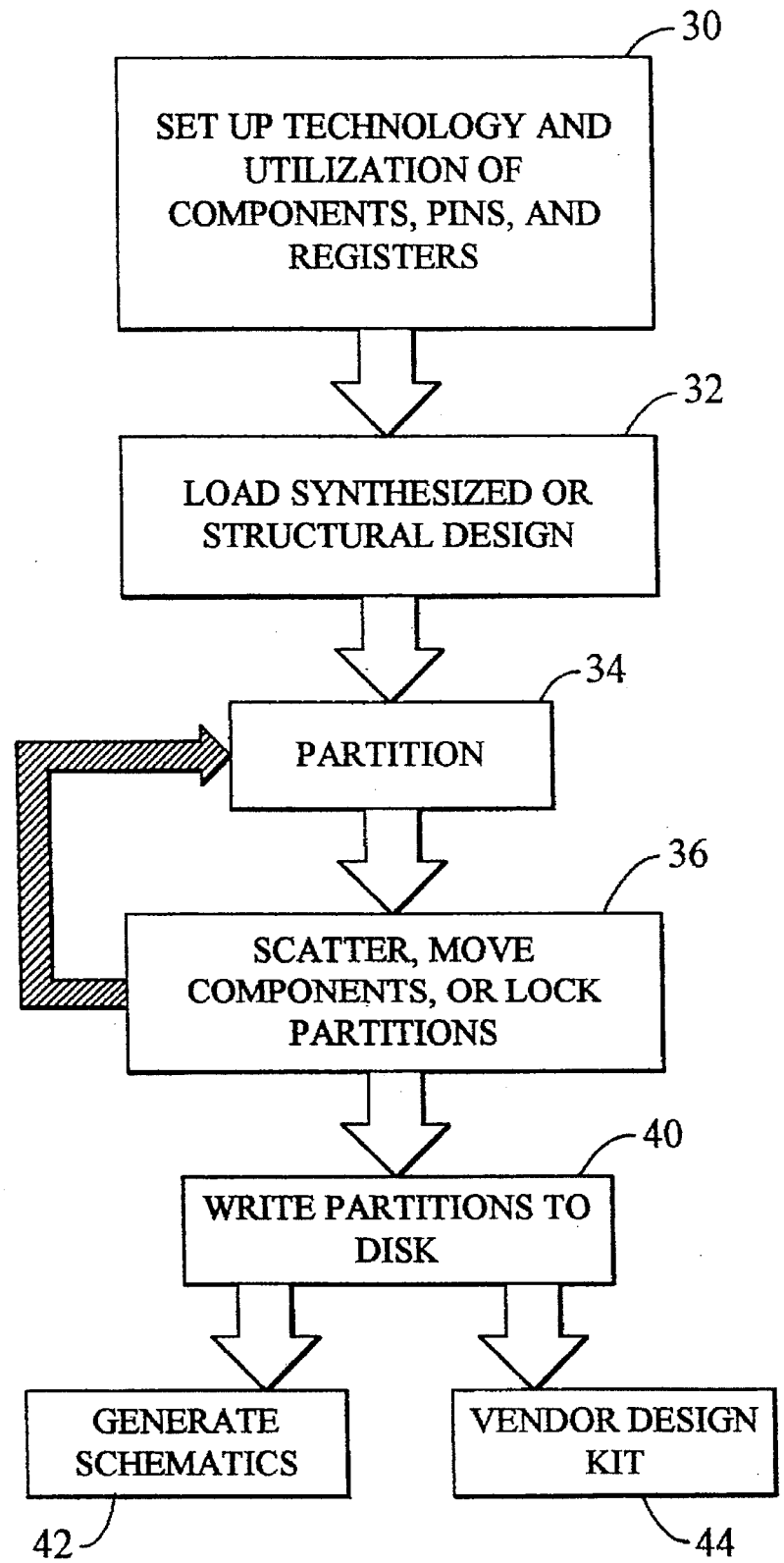
FIG. 5 is a flow diagram of the general operation of the method of the present invention which makes use of a partitioner.

Referring to FIG. 4, the system of the present invention includes a processor or computer 25 which can be a commercially available personal computer or workstation. An input device 27 for scanning or otherwise reading electronic circuit designs is connected to the processor 25. The processor 25 may display modified circuit designs on the output terminal 28 (which may be a printer) or the processor 25 may write the designs to memory 29 which also contains the technology file which will be described below.

before describing the particular operation of the system and method of the present invention, an overview of the steps performed by the system and method would help facilitate this discussion. FIG. 5 shows various steps when partitioning of the circuit design is desired. In step 30 the system is initialized by setting up the appropriate technology file which contains the appropriate information on the necessary components, pins and registers. Then, in step 32, the synthesized or structural design is loaded into memory of a computer. In step 34 the computer automatically partitions the loaded design and in step 36 the user interactively scatters components, moves components and locks partitions. In order to meet the capacity requirements of the targeted package, steps 34 and 36 are interactively performed (if required). Finally, the partitions are written to disk in step 40 at which time the computer will either generate schematics or allow the partitions to be used by a vendor design kit in step 44. In performing step 34, the computer will recognize patterns to determine which circuit will be removed in order to calculate the savings achieved.

Figure 6:
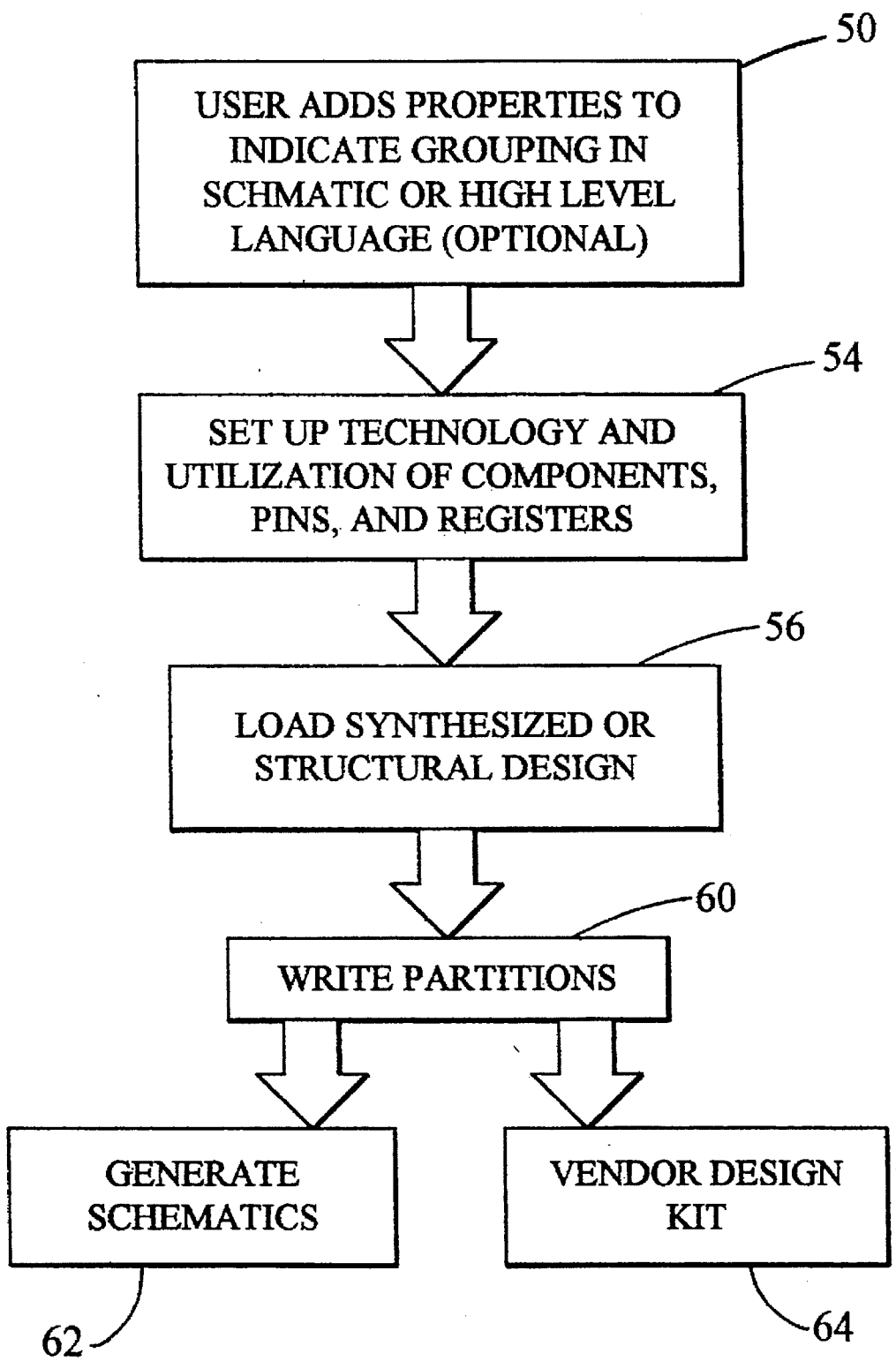
FIG. 6 is a flow diagram of the general operation of the method of the present invention where partitioning is not utilized.

Referring to FIG. 6, the steps utilized by the system and method of the present invention where no partitioning is required will now be described. The designer can add properties to indicate the specific groupings of components desired in the schematic in step 50. These properties cause such groupings to remain together in such circumstances. In step 54 the particular technology file is selected and the synthesized or structural design is loaded in step 56. As is the case in the embodiment shown in FIG. 5, the system then writes the partitions to disk in step 60. Then, it either generates schematics in step 62 or outputs the partition designs to a vendor design kit in step 64.

As described above, the first step taken by a designer utilizing the system and method of the present invention, is the selection of the particular circuit technology and package that is to be used. This technology identifies a list of available packages and the type of logic to be recognized to be placed into pads. Once the technology is selected, the system reads an appropriate technology file, and the designer selects a particular package within that file. The package information contains information concerning number of clocks, sequential/combinational gate count and pin count.

Each technology file contains net lists of designs. The net lists are lists of components and their connections to other components. If desired, the system breaks the design into separate partitions. In most cases, the initial number of partitions into which the design is broken up corresponds to the number of components within the design. In other words, each partition starts out containing one component. In certain circumstances, however, the designer may desire to simply pregroup information or not to partition at all as described above. In such a case, the system determines the necessary logic to add to reduce the pads required for tristate outputs and recognizes appropriate logic to assign to pads and assigns ports. Properties indicated in the original design may be used to pregroup components.

If a property of a component has a name and value which corresponds to the name and value of that property on another component, such components with the same name and value will be grouped together as if they were a unit or primitive. Such a group of components will never be separated, and are placed together in a net list.

Once the design is input into the system and broken into separate partitions, the system determines which partitions belong with each other. The system attempts to join partitions with the ultimate goal of combining the partitions and reducing the pin count. The attempt to join the partitions continues to the point where the joining of the remaining partitions will violate previously selected package limits at which point it stops automatically. The partitioning may be performed manually by the designer or automatically using a commercially available software package such as ViewPartitioner, distributed by ViewLogic Systems, Inc., the assignee of the present application, or any other similar software package. The ViewPartitioner product factors in the savings that may be achieved by mapping logic into pads by recognizing the effect in terms of combinational and sequential gate counts of removing recognized logic. At this point, if the desired number of unique partitions has been achieved the newly created design may now be written to disk, and that design is saved. If the desired number of unique partitions has not been reached the designer may alter one or more of the partitions by locking certain partitions, moving components among such locked partitions, breaking up existing partitions into primitive components and then partitioning again. When the design is written to disk a net list file is written for each partition which corresponds to each package.

A top level net list is written which wires together one or more underlying partitions. It is during this write operation that the mapping, addition of pads and ports and introduction of new logic to reduce pads required for tristates wired together occurs.

As discussed above, when the technology to be used by the system is set, a computer will read the appropriate technology file an example of which is attached as Appendix A. This technology file contains technology, package and cell information which describe the components that can be used in a current design. Each particular technology which is supported by the system will have a separate technology file. Each technology file will have several different fields of information. One of these fields of information includes a list of cells, each with a different number of input pins, available for providing the logic to reduce the pads required by tristate outputs that are tied together while maintaining the same functionality of such tristate outputs.

The fields of information also include mapping information, and the mapping information, which is an abstraction of common logic characteristics of pads, is used to determine when an internal function can be mapped to pad cells which have identical functionality. This information includes a description of the various conditions under which an internal function can be mapped to a pad cell. An example of the syntax for mapping information used in a preferred embodiment of the present invention is provided below.

%ON<source cell name>:<pin name><directionality>
%NO_CONNECT <list of pins>
%NET <source pin name><cell name1>:<pin name>
%MAP_SYM <destination cell>
%MAP_PIN <destination pin name><cell name>:<pin name>

The %ON and "%NET" keywords describe the conditions where mapping occurs to a pad cell. The %ON instruction identifies a source cell name for which the system searches. If a cell with that cell name is found then the system determines whether or not that source cell has a pin that is connected to a terminal of a specified direction. If the mapping information does not include a "%NET" instruction and the %ON conditions are met, the pattern has been recognized and a mapping of an internal function to a pad cell can occur. If the mapping information includes an "%NET" symbol, then an additional condition specified in the "%NET" instruction must be met. This condition refers to another cell (with cell name1) which is connected to the original source cell identified in the "%ON" clause. If another pin of that source symbol called "source pin name" is connected to a specified pin of another cell (a pin name of cell name1) then the logic of the cells identified by the "source cell name" and "cell name1" is replaced by a new pad cell which is specified in the %MAP_SYM" command. The "%MAP_PIN" command details how each pad of the replacement cell is to be mapped to the pin on the source cells.

It is often the case that the logic that may be utilized in a pad cell is less complex than the logic available in an internal cell. For this reason, mapping from a given internal cell to a given pad cell may only be possible if part of the internal cell is unused. As an example, an internal flip-flop may have a clock enable while the functionally similar pad cell may not. The internal flip-flop can then only be mapped to the pad cell if the clock enable pin of the internal flip-flop is unconnected. Generally, vendor place and route tools would deal correctly with the unconnected internal pin. To enable the system to capture the information, the mapping information may specify that a given mapping is only possible if the named pins of the internal element are not connected.

An example of the actual commands that may be used to map an external D flip-flop are set forth below:

%ON dff:q out
%NO CONNECT set, clear
%NET d buf:out
%MAP SYM pad_dff
%MAP_PIN d buf:in
%MAP_PIN q dff:q
%MAP_PIN clk dff:clk In this example, the %ON command identifies the D flip-flop cell which can be mapped to a pad cell. Such a D flip-flop must have a q pin which is a partition output. In addition, as identified by the "%N$_{13}$ CONNECT set, clear" command, the D flip-flop must not have its set and clear pins connected. In addition, the "%NET" command indicates that the d pin of the flip-flop must be connected to a pin called "out" of a buf cell. If all three of these conditions are met, then this internal logic is mapped to a pad_dff cell with (i) the d pin of the pad cell being connnected to the net connected to the in pin of the bur cell, (ii) the q pin of the pad cell being connected to the net connected to the q pin of the dff cell and (iii) the CLK pin of the pad cell being connected to the net connected to the CLK pin of the D flip-flop.

Figure 7:
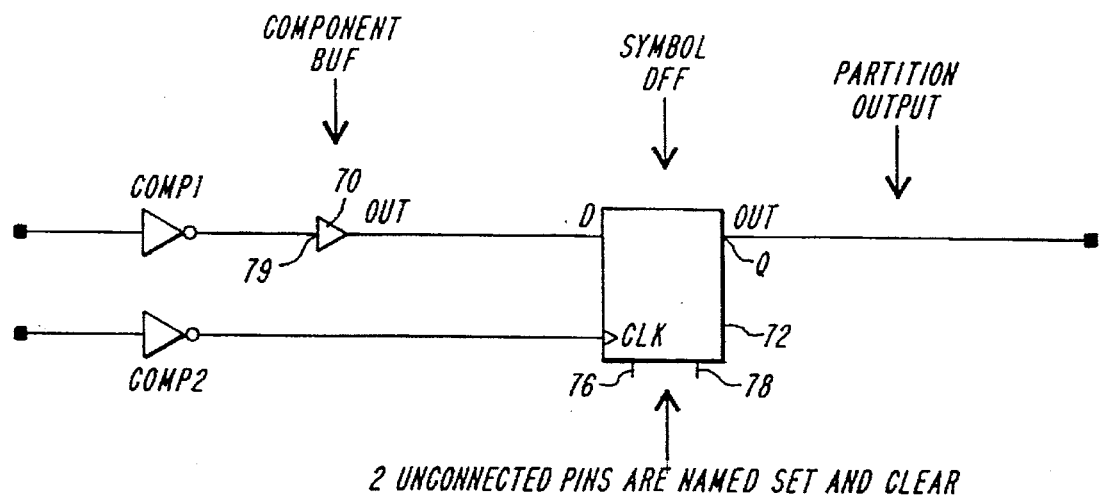
FIG. 7 is a schematic diagram showing an electronic circuit before mapping.
Figure 8:
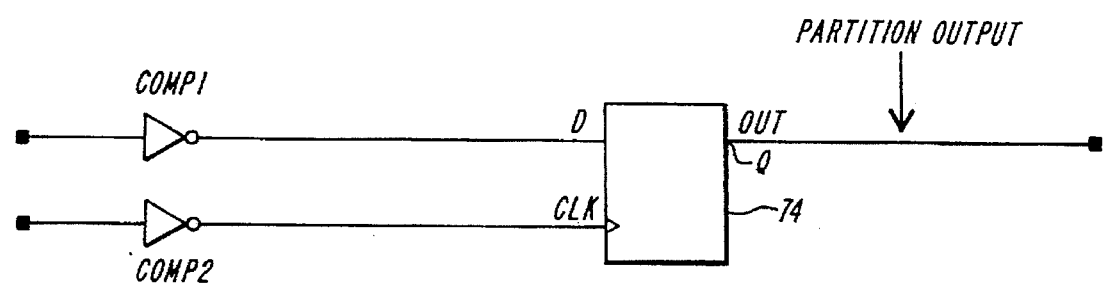
FIG. 8 is a schematic diagram of the circuit of FIG. 7 shown after mapping of circuitry to a pad by the system and method of the present invention.

Referring to FIG. 7, the same example will be explained in connection with a schematic diagram. In this example, two internal cells 70, 72 will be replaced by a pad cell 74 shown in FIG. 8. In FIG. 7, since (i) the net connected to pin Q of cell 72 is a chip output, (ii) there are no nets connected to the set and. clear pins 76, 78 and (iii) there is a connection from the. output pin out of cell 70 to the D pin of cell 72, then both cells 70 and 72 are replaced with pad cell 74 in FIG. 8. The placement is accomplished by connecting the net connected to input 79 of cell 70 to pin D of cell 74. Next the net connected to pin Q of cell 72 is connected to pin Q of cell 74. Finally, the net connected to the CLK pin of cell 72 is connected to the CLK pin of cell 74.

The technology file also includes package information which generally describes the name of the package (e.g., XC3090PQ160 of XILINX) and the available resources on that package. Such resources include the number of combinational gates and sequential gates that are available. In addition, this information will also include a number of available pins and the number of clocks available in this package.

The third type of information contained in the technology file is cell information. This information includes the name of the cell (e.g., AND2) and indications of each pin and their types. In addition to specifying the name of each cell, the type of cell and the combinational count and sequential count used by such cell are specified. In general, the types of cells may be: internal cell, input pad, output pad, bidirectional pad, tristate pad, clock pad, input port, output port, and bidirectional port. The "type of cell" information is used by the system to determine which cell is used when adding pad cells to the electronic circuit design. The input port, output port and bidirectional port cells are used as termination devices to indicate that the net attached to such cell is a net that will be going off of the chip. The directionality of the net indicates whether the cell is an input, output, bidirectional or tristate cell. The only exception occurs when the cell is a clock pad cell in which case the net carries a clock signal.

The description of the pin. portion of each "CELL" statement will indicate all the pins that are output pins, input pins, bidirectional pins, tristate pins and tristate enable pins. It is the tristate enable pin of the pad that is used by the system to determine where the output of the logic, introduced to the design. to reduce the number of pads required for tristate outputs wired together, is connected. A sample technology file is shown in Appendix A. In this file the "%OUTPUT", "%INPUT", "%BI", "%TRI", "%TRI_EN", respectively, identify these pins.

Figure 9:
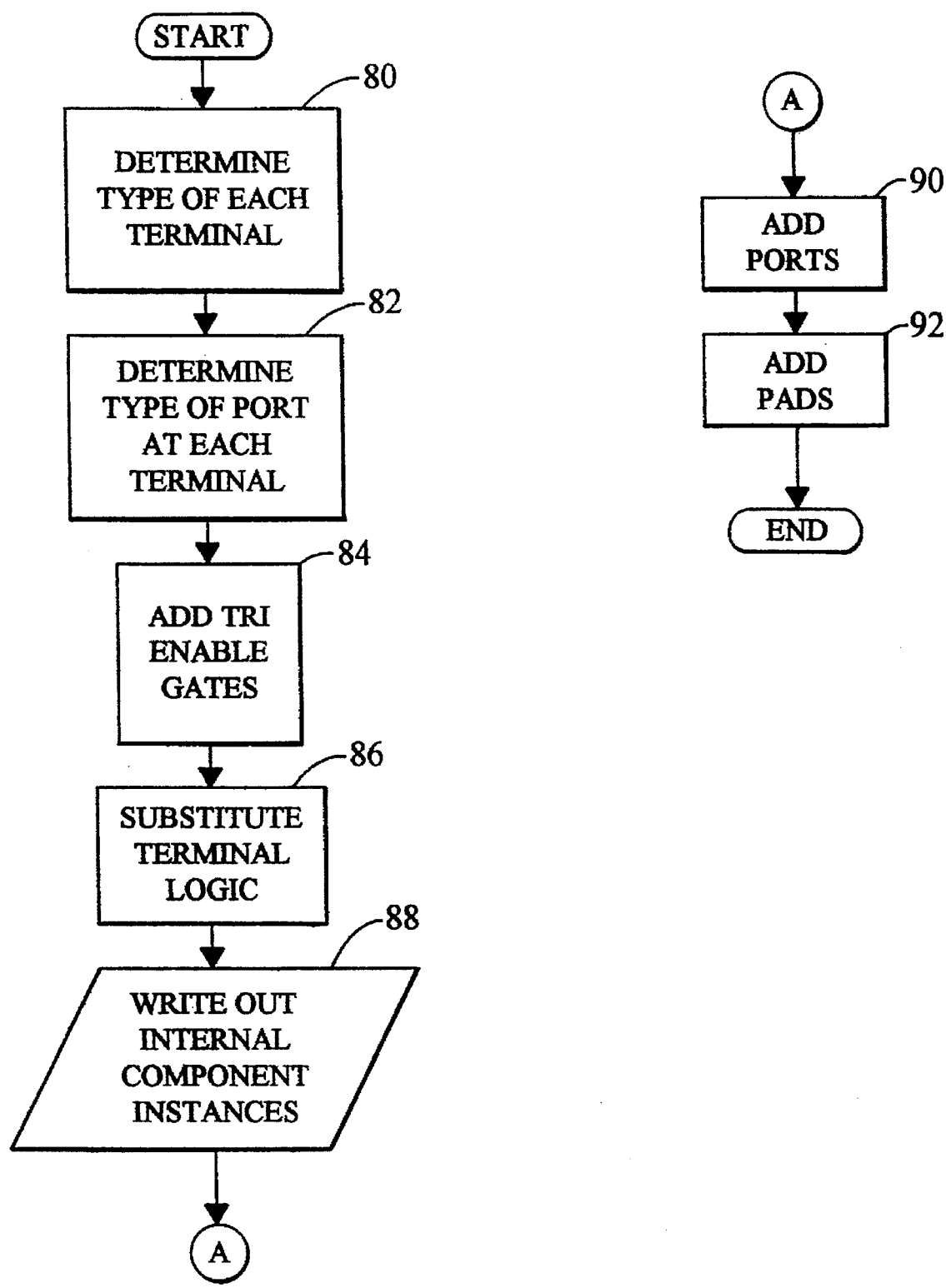
FIG. 9 is a flow chart of the operation of the system and method of the present invention.

Referring to FIG. 9 the process utilized by the system of the present invention for creating the new optimized design which replaces logic in internal circuits with logic in pads will now be described. First, in step 80 the system determines the terminal type for each net which is a terminal of the partition. Each port at such terminals with respect to a given partition is examined to determine whether the port is an input, output, tristate or bidirectional port in step 82.

Figure 10A:
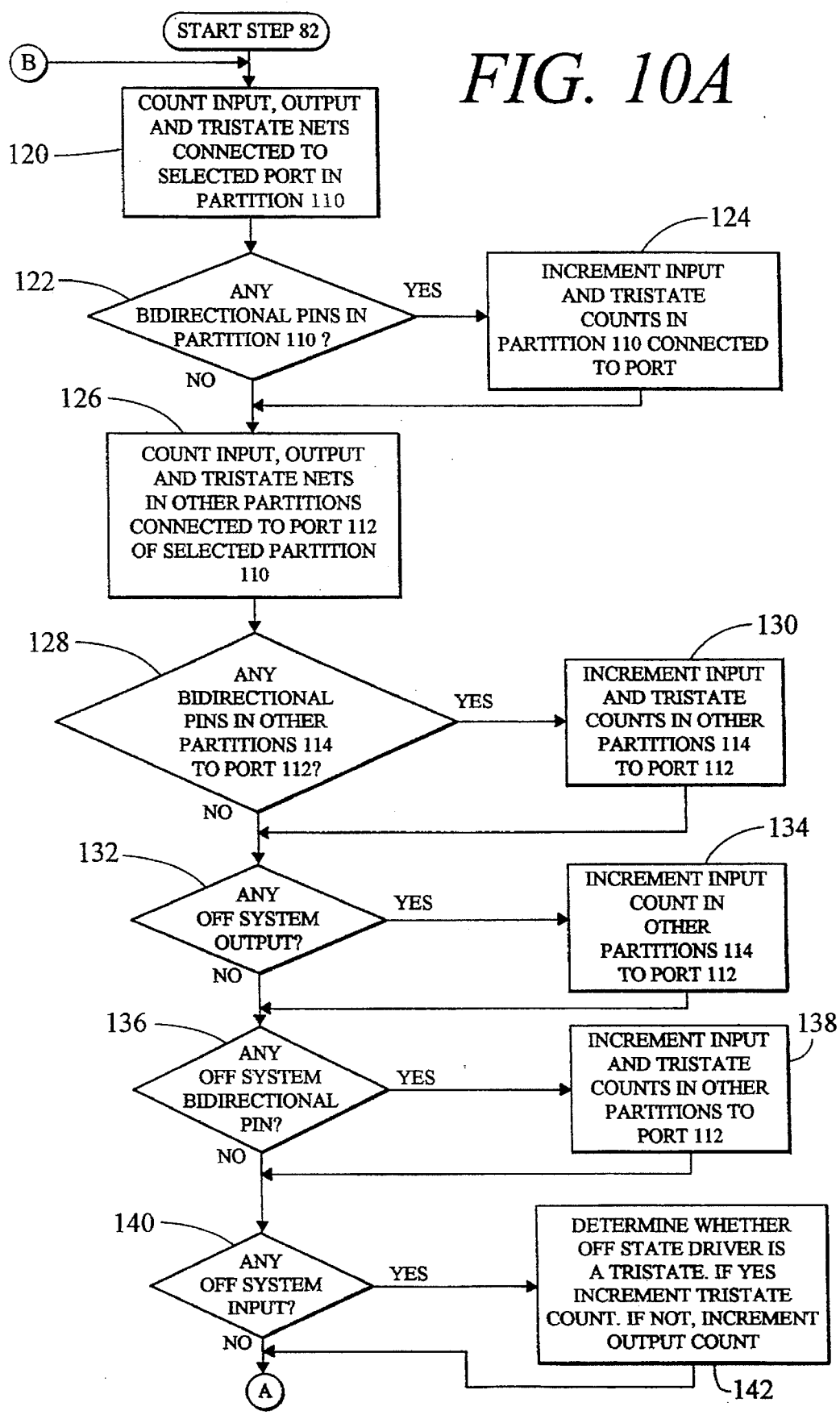
FIGS. 10a and 10b are flow charts of the steps used by the system and method of the present invention to determine the type of port.
Figure 10B:
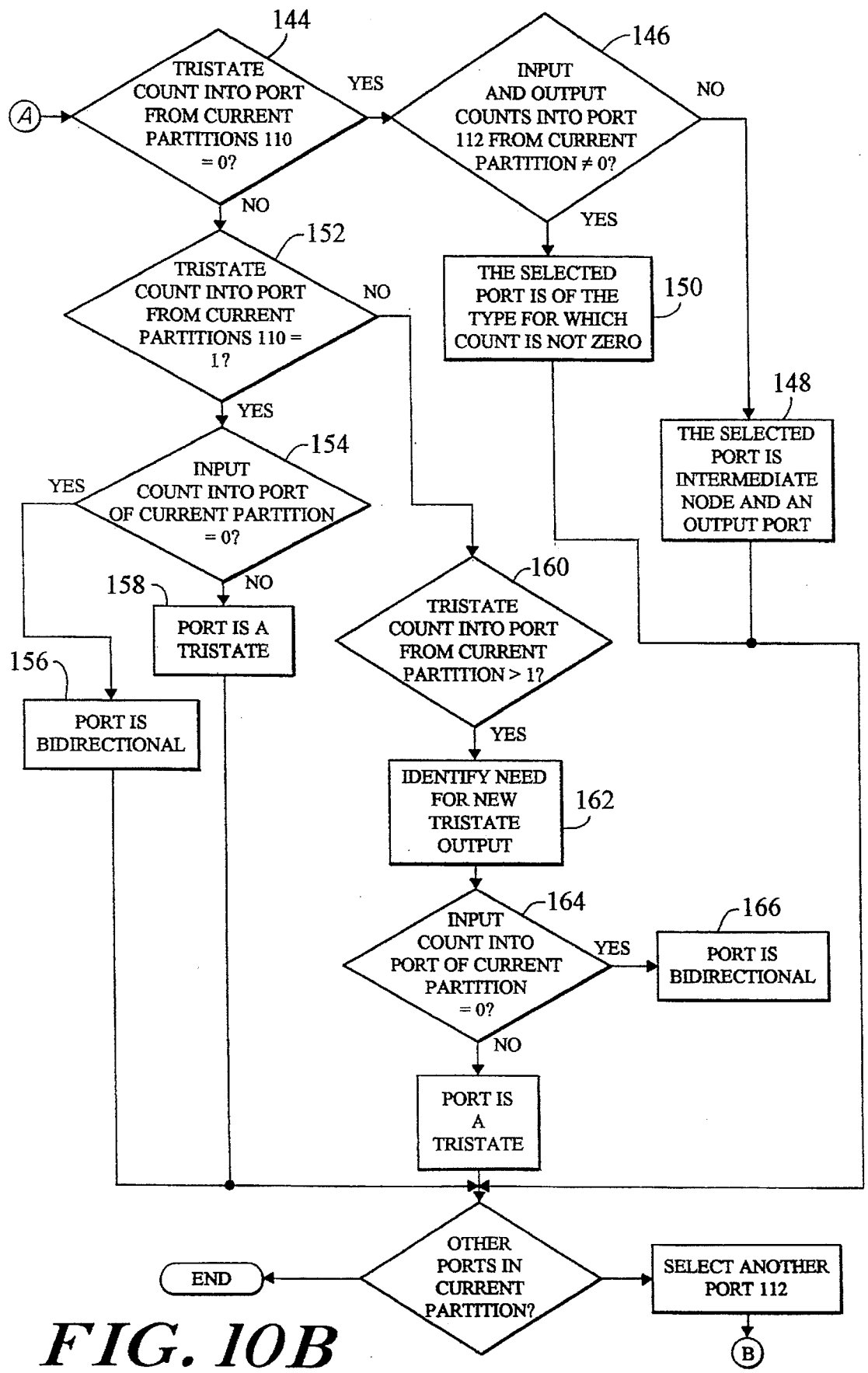
Figure 11A:
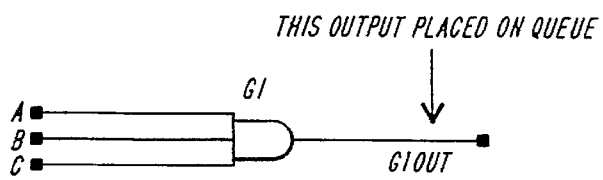
FIGS. 11a–11d are schematic diagrams of the stages of a circuit design for which a balanced binary tree of gates is created.
Figure 11B:
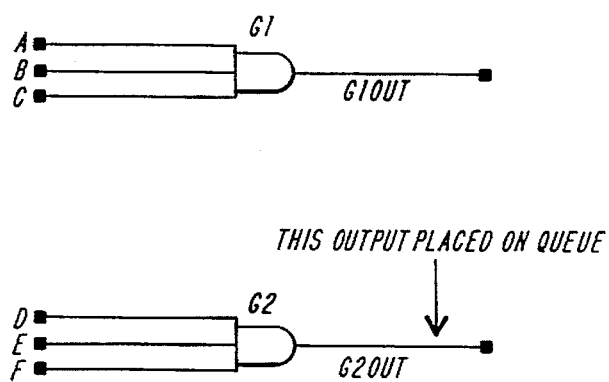
Figure 11C:
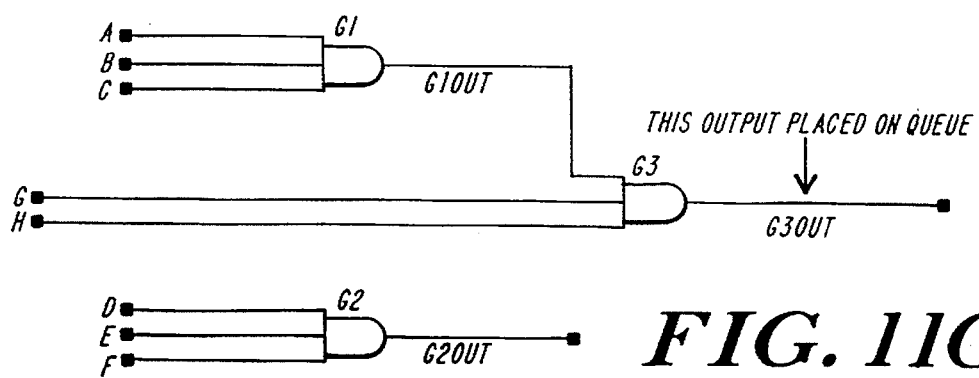
Figure 11D:
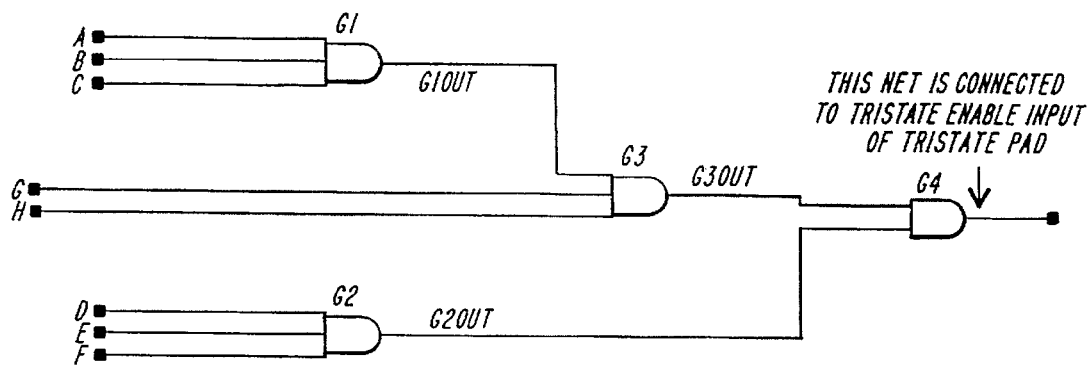
Figure 28:
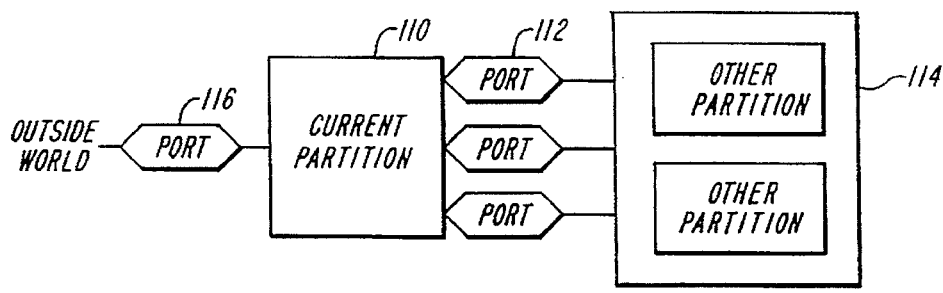
FIG. 28 is a simplified block diagram of the relationship between partitions and ports.

Referring also to FIG. 10a–10b, to determine the type of port, the system examines one partition at a time and one port 112 in such partition at a time. For the current partition 110 (see FIG. 28) being examined by the system, the input, output and tristate nets in the current partition 110 which are connected to the selected port 112 are counted in step 120. If a bidirectional pin is identified on the partition 110, at the selected port in step 120 both the input count and the tristate count are incremented by the number of bidirectional pins in step 124. Next, the input, output and tristate nets within the other partitions 114, that are connected to the current selected port 112, are counted in step 126. Again, a bidirectional pin of the partition 114 identified in step 128 increments both the input count and the tristate count by the number of bidirectional pins in step 130. If there is any off-system connection to a port 116, the count of inputs, outputs and tristates for the remaining parasitic, ns 114 is adjusted as follows: (a) if there is an off-system output found in step 132, the number of inputs from the remaining partitions 114 into selected port 112 is incremented by the number of off system outputs in step, 134; (b) if there is an off-system bidirectional output found in step 136, the number of inputs and tristate drivers in the remaining partitions 114 into selected port 112 is incremented by the number of off-system bidirectional pins in step 138; and (c) if there is an off-system input found in step 140, the system heuristically determines whether the off-system driver is tristate or not in step 142. If there are any tristate drivers already present on the selected port 112, it is assumed that the off-system driver is a tristate and the number of tristates in the remaining partitions 114 into the selected port 112 is incremented. If, however, there are no tristates on the current selected port 112, then the off-system driver drives port 112 and the number of outputs in the remaining partitions 114 into port 112 is incremented.

If the counts for the tristates in the current partitions 112 connected the selected port 112 of current partition 110 is determined in step 144 to be 0, then the port 112 is either a simple input or a simple output. If it is determined in step 146 that the current partition input count and the current partition output count are both not 0, then the port 112 is identified as an intermediate node in step 148 which goes off partition 110 and the port 112 is an output port. If either the input count or output count is zero, port 112 is identified with the type of the non-zero count (i.e. if the input count is non-zero, then the port is an input port). If the tristate count of the current partition 110 into the selected port is 1 in step 152, then the port 112 is either a tristate or bidirectional port. If the current partition 110 input count in step 154 is 0, then the port 112 is identified as bidirectional in step 156, otherwise it is identified as a tristate port in step 158. Finally, in the case where the current partition 110 tristate count is more than 1 in step 160, a new tristate output must be manufactured. In that case, the port 112 is either a tristate or bidirectional port. If the current partition's input count is 0 in step 164, then the port 112 is identified as a bidirectional port in step 166, otherwise it is identified as a tristate port in step 168. This process is then repeated for other ports in the partition 110.

After determining the terminal type, the system, in step 84 (FIG. 9), adds tri enable gates, if appropriate. If there are K tristate gates connected together, the K tristate enable input signals going into each tristate gate are connected into an N input gate of a particular type as are identified as available in the technology file. It is possible that the technology file may not have an available gate with the number of required inputs. In such a case, a tree of those gates must be constructed from gates with fewer than N inputs. A balanced binary tree of gates is constructed using the fewest possible of these N input gates.

To create this balanced binary tree, all of the N inputs are placed in a queue Q and the number of elements on the queue Q is then determined and assigned to S. Next, the number of inputs on the largest gate with S or fewer inputs is determined and that number of inputs is assigned to L. Then a new instance of a new gate G with L inputs is created and the first L signals from the queue Q are transferred to the inputs of the new gate G. If the queue Q is not empty, then the output signal of the new gate G is placed onto the end of the queue Q and the process is reiterated starting with the step of counting the number of elements on the queue Q. If the queue Q is empty the output of the new gate G is saved and will be later connected to a tristate enable input of the tristate pad, as defined in the technology file.

This process will now be described in connection with the following example and FIGS. 11a–11d. This example assumes that the number of inputs equals 8, and only 2 or 3-input gates are available. The inputs are labeled a through h. In the first pass (FIG. 11a), inputs a, b, and c are connected to a new gate G1, and, its output is placed on the end of the queue. The queue then contains six elements (d through h, G1out). In the second pass (FIG. 11b), inputs d, e and f are connected to a new gate G2 and now the queue contains g, h and G1out and G2out. In the third pass (FIG. 11c), g, h and G1out are connected to a new gate G3 and the queue contains G2out and G3out. These inputs are then connected to a new gate G4 and the output of G4 is saved for later connection to the tristate enable input of the tristate pad that will be added, at which time this process is terminated.

Figure 12:
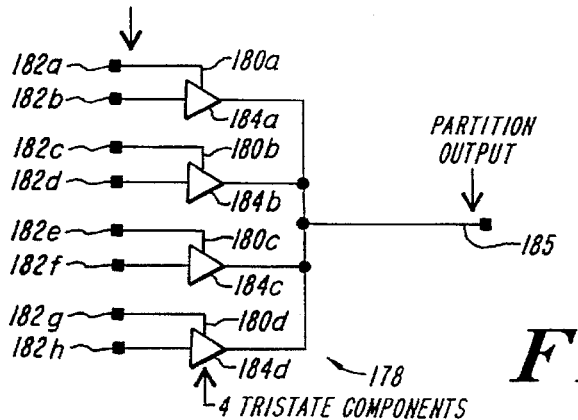
FIG. 12 is a schematic diagram of four wired tristate outputs prior to the addition of tri-enable gates.
Figure 13:
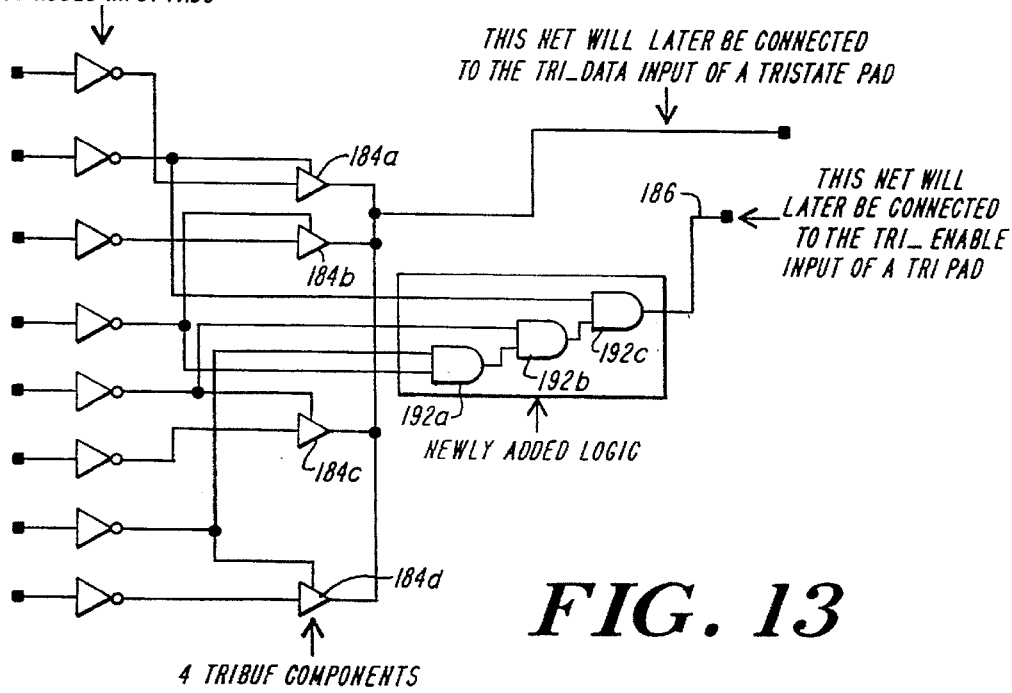
FIG. 13 is a schematic diagram of the circuits shown in FIG. 12 after logic is added when the tristate components are tied together.

Referring now to FIGS. 12–13, the process in which the system introduces new logic into a design shown in FIG. 12 as a result of tristates being wired together to achieve the resulting logic shown in FIG. 13 will now be described. In FIG. 12, all nets 180a–180d that were connected to the tristate enable input of the tristate components 184a–184d are now wired .into the available tri-enable gates, which in this case are exclusively two input AND gates 192a–192c. The result of these gates is an output 186 which will later be connected to the tristate enable input of a tristate pad.

Referring to FIG. 12 an electronic circuit 178 having 4 tristate components 184a–184d is shown. This partition of the circuit has 8 partition inputs 182a–182h and one partition output 185. FIG. 13 shows the resulting circuit after logic is added that ties together the tristate circuits. In FIG. 12 it is important to note that all nets that were connected to the tristate enable input of the tristate components are now wired into the available gates, which in this case are exclusively 2-input AND gates 192a–192c. Results of the series of gates is an output 186 which will later be connected to the tristate enable input of the tristate pad.

After the tri enable gates are added, the system in step 86 (FIG. 9) recognizes logic to be substituted and adds the appropriate pads and ports. The system of the present invention must recognize nets that are so-called trigger nets which trigger a mapping to occur. For each net which spans partitions or is a system terminal, the system will determine:

(1) does the net have a specified directionality, (2) does the net connect with a specified pin P1 of a certain type of gate G1, and (3) are any other pins of gate G1 connected to specific pins of another gate G2 (if any), and (4) are all the source pins of gate G1 that are specified (if any) to be unconnected, actually unconnected. If the above criteria is met, the net is tagged as a trigger net which indicates that a mapping is to occur. A unique identification is created and assigned to the first and, optionally if condition 3 is satisfied, second source gates. An occurrence of a specified destination symbol is instantiated and is marked as an added pad once a mapping is determined to be appropriate. Each specified pin of an instance of a source gate G1 is then connected with the specified destination pins on the instance of the destination symbol. If appropriate, each specified pin of the instance of a second source gate G2 is connected with the specified destination pins on the instance of the destination symbol. Finally, the instance of a source gate G1 and its net connections are tagged as removed. If there is a second source gate G2, its net connections may also be tagged as removed.

Figure 14:
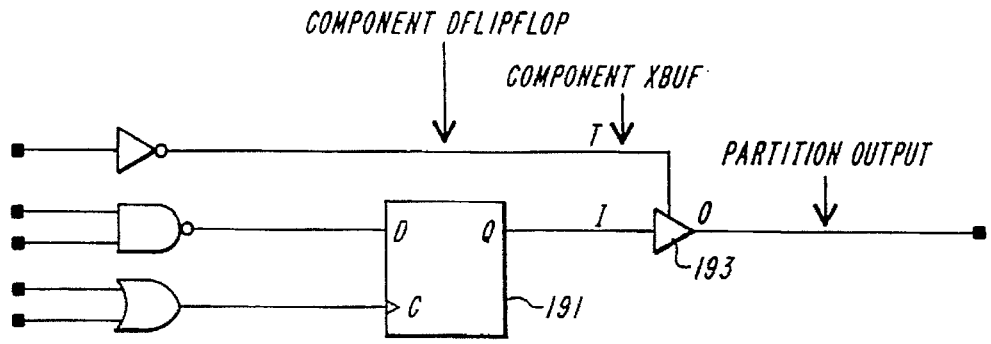
FIG. 14 is a schematic diagram of an electronic circuit prior to being mapped to an output pad.
Figure 15:
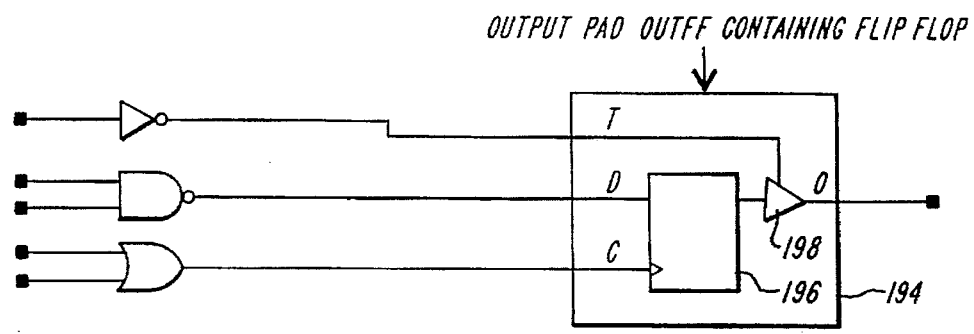
FIG. 15 is a schematic diagram of an electronic circuit of FIG. 14 to which an output pad has been mapped.

Turning now to FIG. 14, an electronic circuit with a D flip-flop 191 and a tristate component 193 is shown which would trigger a substitution into a terminal pad if the following mapping statement existed. FIG. 15 shows the circuit in FIG. 14 after an output pad 194 containing the flip-flop 191 and tristate buffer 193 has been substituted in accordance with the following mapping conditions.

%ON XBUF:O %OUT
%NET I DFLIPFLOP:Q
%MAP_SYM OUTFF
%MAP_PIN T XBUF:T
%MAP_PIN D DFLIPFLOP:D
%MAP_PIN C DFLIPFLOP:C
%MAP_PIN O XBUF:O

The %ON instruction indicates that if an XBUF component exists with an O pin whose connected net is a partition output and, in accordance with the %NET instruction, the net connected to the I input of the XBUF component is connected to the Q output of a D flip flop, then a substitution is triggered in accordance with the %MAP instructions. The %MAP instructions indicate the D flip flop and XBUF component should be replaced by an output pad OUTFF with the pins connected as identified by the %MAP_PIN.

After the system recognizes and substitutes terminal logic, it writes out the internal component instances of the resulting design and the connected nets of each component in step 88 (FIG. 9). Newly added components like the tri-enable gates and the added pads are output to net list file by the system. Removed matched logic gates which were tagged as deleted are not written out.

Next, the system writes out connections for each of the newly added components. When writing out the connections on each component, net names of nets which do not connect to terminals or nets which are trigger nets may be written out to disk either by their designer assigned names or by an internal ID. Existing net names may be retained in such cases because no new nets are needed or because no new net names have been added in the case where the nets are totally internal. Additionally, if a mapping has occurred, it is guaranteed that no new nets are required since a mapping occurs with pads and those pads connect to existing nets. Nets that are connected to terminals or those which are not trigger nets do, however, cause net names to be added because in such cases a pad would be needed to be inserted which necessitates the renaming of the nets that the pad is connected to on the inside of the package.

The net is renamed by first determining the terminal type of the net, after which a buffer is loaded with the current net name of that net. If the pin type of the component whose connections are being written out is determined to be an input pin of a bidirectional terminal a string such as PREFIX_PREFIX_ is prepended to the name. Otherwise, the string PREFIX_ is prepended to the name for nets connected to output pins.

Figure 16:
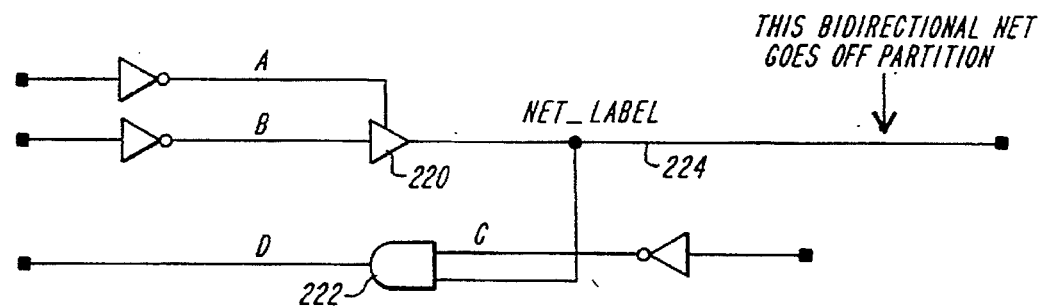
FIG. 16 is a schematic diagram showing two components connected to a bidirectional terminal before renaming of the net.
Figure 17:
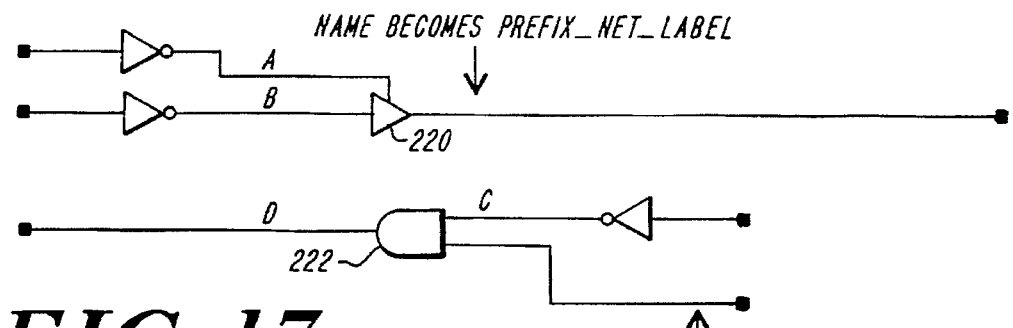
FIG. 17 is a schematic diagram showing the two components of FIG. 16 connected to a bidirectional terminal after the renaming of the nets.

Turning now to FIG. 16, this process will be described in an example. Two components 220, 222 are connected to a bi-directional net 224 (also called NET_LABEL). In this case, the net names are indicated. In FIG. 17 the net names of the component 220 becomes A,B and PREFIX_NETLABEL the name to which a single PREFIX has been added. The net name attached to the AND gate 222 becomes C,D and PREFIX_PREFIX_NET_LABEL which is the name to which the PREFIX_PREFIX has been added. The reason for this naming convention is that two internal nets must be added when connecting bidirectional pads. These nets are later connected to the appropriate pins of the actual bidirectional pad. The principal reason for the renaming is to preserve the integrity of the terminal name (NET_LABEL) which is visible off-partition. Additionally, for bidirectionals it is because two nets are required to be created where one originally existed.

Figure 18:
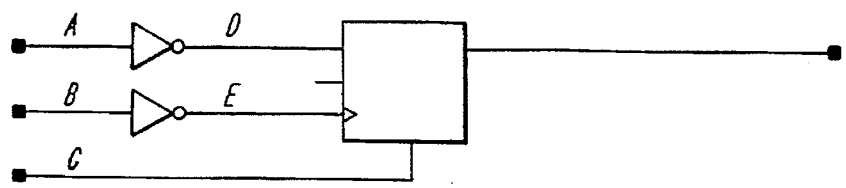
FIG. 18 is a schematic diagram of another electronic circuit to which the system and method of the present invention will add input pads.
Figure 19:
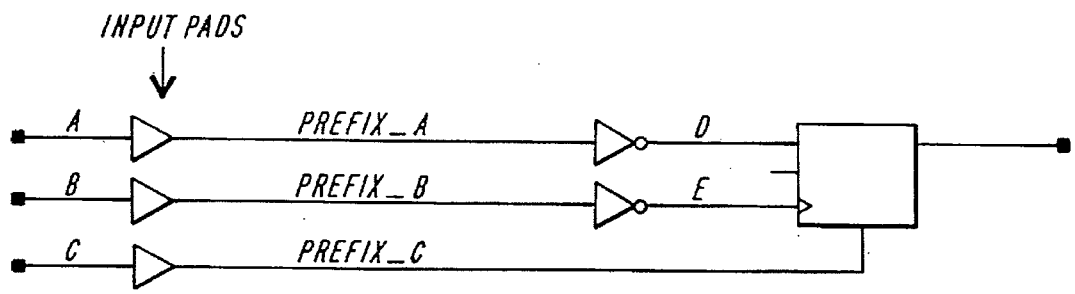
FIG. 19 is a schematic diagram showing the net names assigned to the nets connecting to external circuits of the circuit shown in FIG. 18 after input pads have been added.

In all other cases of internal components, if a net connected to that component goes off-partition and it needs to be connected to any other type of pad besides a bi-directional pad, as described above, the net going off-partition is simply renamed by prepending PREFIX_ to the net name. For example, FIG. 18 shows the nets A, B and C as input nets which are shown prior to having pads and ports added with net names. Then, as shown in FIG. 19 names given to the nets connected to the outside remain the same and the label PREFIX_ is prepended to the net names of the A, B, C terminals because pads would be connected to these inputs and the net name at the terminals must be preserved.

After the internal component instances are written out, ports are added in step 90 (FIG. 9). For each terminal, the type of port that was determined above in connection with FIGS. 10a–10b. From this type, the port name of the port cell to be added based on this port type is matched from the technology file. The port name is the same as the net to which it is being attached.

In step 92 (FIG. 9), the system adds the pads. For all terminals except for those that are trigger nets, the pad that is connected to the port and to the logic on the inside of the package is written out. Again, the type of this terminal is determined, and if there is a pad which corresponds to this type, then an instance of that type of pad is written out.

Next, the connections to the pads are written. Which connections are written out is entirely dependent on the type of terminal and hence the type of pad cell. In addition, the pin type of the pad being added is also taken into consideration. The four types of pad cells that are added are either an input pad, an output pad, a tristate pad or a bidirectional pad.

In the case where an output pad is being added, if the pin type is an input pin or an input to a bidirectional pad as specified in the technology file, then the connection is assigned the name PREFIX_ name, where "name" is the internal ID of the net or the label name of the net. Otherwise, the net name is simply the internal ID or label. The reason for this procedure is that the output pin always connects to the port and must not be renamed in order to preserve the integrity of the terminal names.

Figure 20:
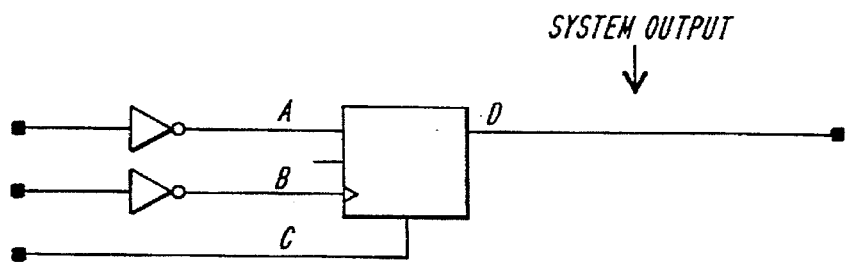
FIG. 20 is a schematic diagram of an electronic circuit requiring an output pad.
Figure 21:
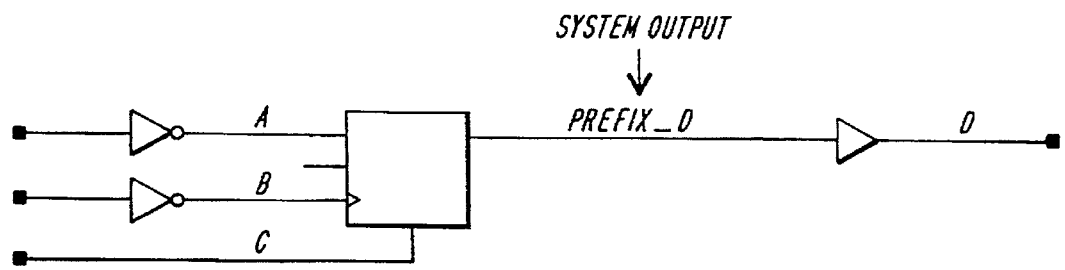
FIG. 21 is a schematic diagram of the circuit shown in FIG. 20 in which an output pad has been added and nets have been renamed.

Referring to FIG. 20, an electronic circuit is shown which requires an output pad. The output net name D in this case must be preserved and in FIG. 21 this circuit is shown with the pad added to the circuit with the new net name for the connection to the pad being inserted and the net name of the output pin being preserved.

Figure 22:
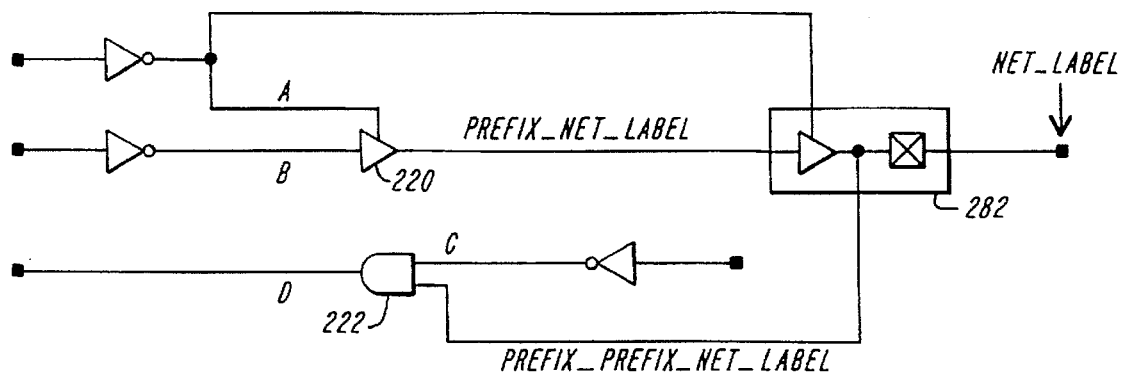
FIG. 22 is a schematic diagram of the electronic circuits shown in FIG. 16 in which pads have been inserted and new net names have been assigned by the system and method of the present invention.

In the case of a bidirectional pad shown in FIG. 22, if the net is bidirectional and a bidirectional pad is supported in the technology file, the input of the bidirectional pad 282 is attached to a new net called PREFIX_NET_LABEL coming from the driver of the bidirectional net. The output of the bidirectional pad 282 is attached to another newly named net PREFIX_PREFIX_NET_LABEL being driven on the chip. FIG. 16 shows electronic circuit with net names where a bidirectional pad is required and FIG. 22 shows this circuit with the pads inserted and the new net names assigned. All the net names at the terminals are preserved. In particular, the system knows that the input pin of the bidirectional pad (from the technology file) causes the net to be renamed PREFIX_NET_LABEL, while the output pin is connected to a net called PREFIX_PREFIX_NET_LABEL. Net A is connected to the tristate enable pin from the situation where tri-enable gates were added. In this case, no tri-enable gates were added but the original tristate input (the original Net A) gets connected to the tristate enable input of the bi-directional pad.

Figure 23:
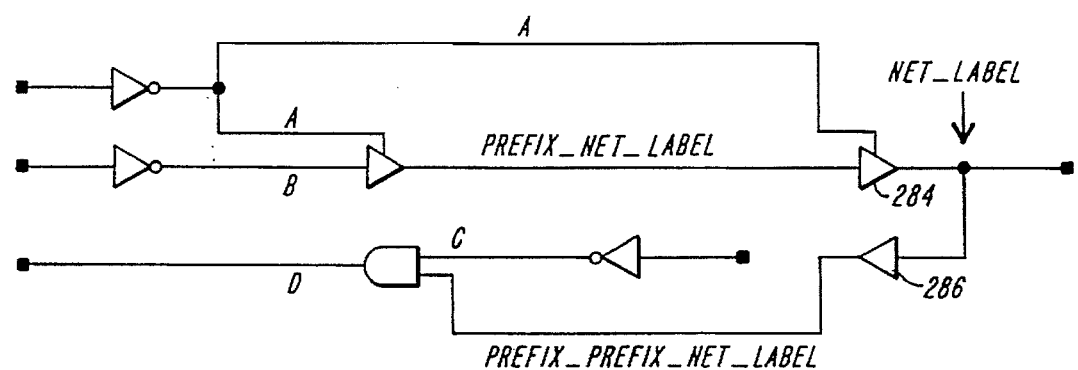
FIG. 23 is a schematic diagram of the electronic circuits shown in FIG. 16 in which two pads are added by the system and method of the present invention because no bidirectional pad exists in the appropriate library.

If the net is bidirectional and a bidirectional pad does not exist, then both tristate 284 and an input pad 286 must be added as shown in FIG. 23. The input pin of such input pad 286 connects to the port and the output pin of the pad connects to the components being driven within the partition. That connection occurs through a net named PREFIX_PREFIX_NET_LABEL. The data input of the tristate pad is driven by the components which drive the bi-directional and then that net is called PREFIX_NET_LABEL.

In the case where an input pad is being added, the output pin of the input pad is connected to a component inside the partition and is called PREFIX_netname. The input pin of the input pad is connected to the port and has the name netname.

Figure 24:
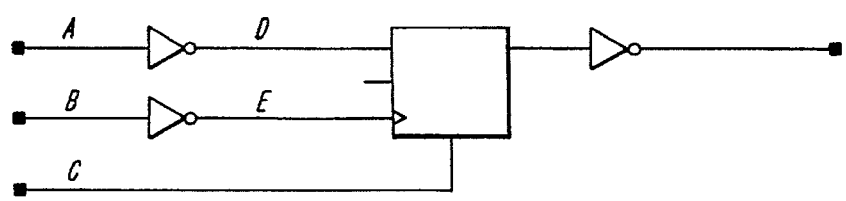
FIG. 24 is a schematic diagram of an electronic circuit requiring input pads.
Figure 25:
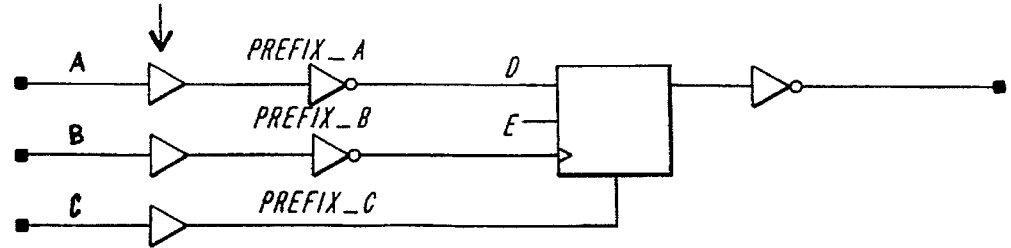
FIG. 25 is a schematic diagram of an electronic circuit shown in FIG. 24 in which pads have been inserted with net names by the system and method of the present invention.

Referring to FIG. 24 a circuit is shown with the net names labeled where an input pad is required for the input terminals A, B and C. FIG. 25 shows this circuit with the added input pads and the new net names assigned. Again, as in previous cases, the net names at the terminals have been preserved.

Figure 26:
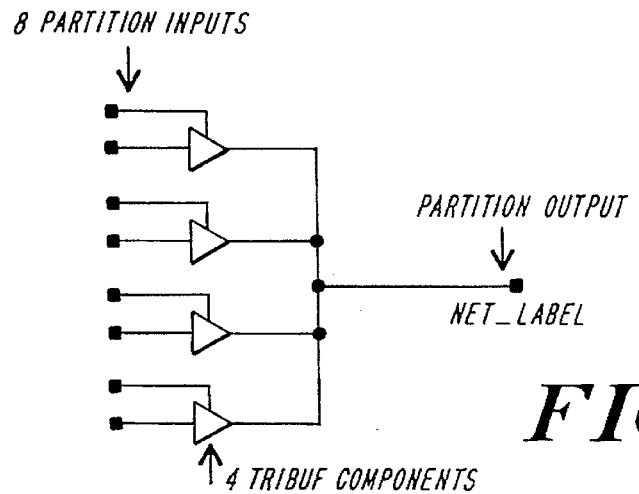
FIG. 26 is a schematic diagram of an electronic circuit with wired tristate outputs before tri enable gates are added by the system and method of the present invention.
Figure 27:
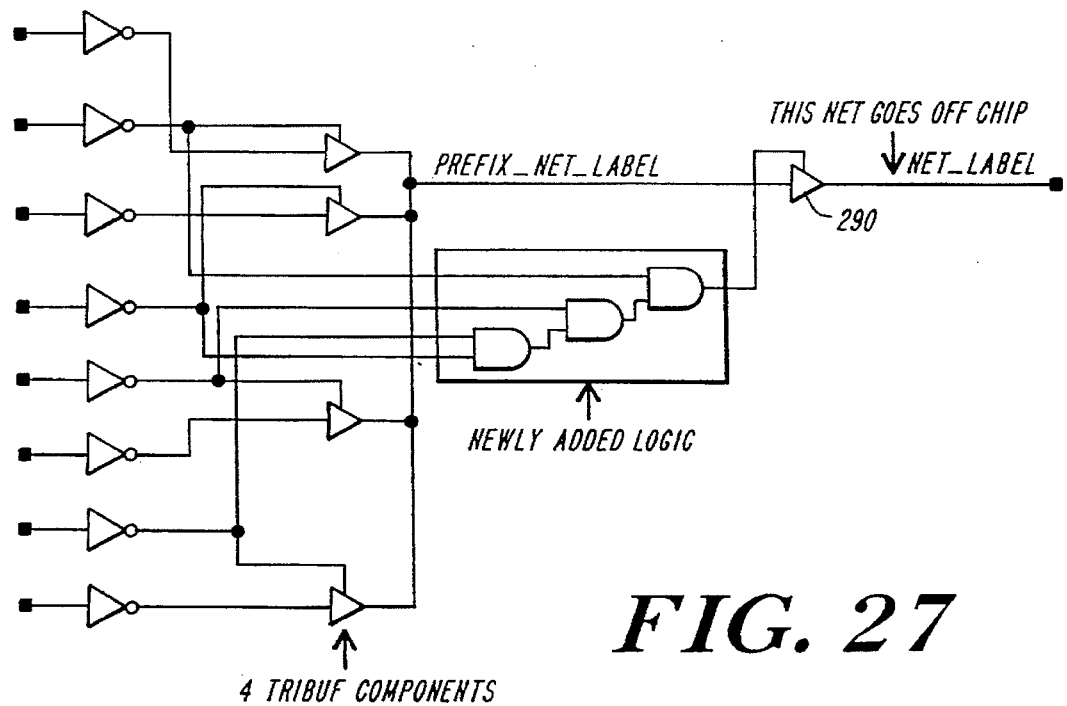
FIG. 27 is a schematic diagram, of the electronic circuit shown in FIG. 26 which shows pads added to the circuit and the new net names assigned by the system and method of the present invention.

Referring to FIG. 27, in the case where a tristate pad 290 needs to be added, the input of that pad is connected to any tristate output components driving the net. The tristate enable gate output must then be found and the tristate enable pin of the tristate pad is attached to the tristate enable gate output. The tristates which were tied together to the input of the tristate pad with the name PREFIX_NET_LABEL are connected. FIG. 26 shows an electronic circuit with net names where a tristate pad is required and FIG. 27 shows this design with the pads and new net names. Again, as in all previous cases, the net names at the terminals are preserved.

While the foregoing invention has been described with reference with its preferred embodiments, various alterations and modifications will occur to those skilled in the art. All such variations and alterations are intended to fall within the scope of the appended claims.

APPENDIX A

```
|***********************************************************
|
|     Title:   Xilinx 3000 series partition data file

%START_TECH

%TRI_EN_GATES AND2 AND3 AND4 AND5

|
| Mapping of I/O buffs and flip flops
|
| CASE1: TBUF -> OBUFT

%ON TBUF:O %OUT
  %MAP_SYM OBUFT
  %MAP_PIN T TBUF:T
  %MAP_PIN I TBUF:I
  %MAP_PIN O TBUF:O

| BUF to IBUF

%ON BUF:I %IN
  %MAP_SYM IBUF
  %MAP_PIN I BUF:I
  %MAP_PIN O BUF:O

| BUF to OBUF

%ON BUF:O %OUT
  %MAP_SYM OBUF
  %MAP_PIN I BUF:I
  %MAP_PIN O BUF:O

| CASE2: DFF TO OUTFF

%ON DFF:Q %OUT
  %NO_CONNECT CE RD
  %MAP_SYM OUTFF
  %MAP_PIN D DFF:D
  %MAP_PIN C DFF:C
  %MAP_PIN Q DFF:Q

| CASE3: DFF TO INFF
```

```
%ON DFF:D %IN
%NO_CONNECT CE RD
%MAP_SYM INFF
%MAP_PIN D DFF:D
%MAP_PIN C DFF:C
%MAP_PIN Q DFF:Q

%END

|----------------------------------------------------------
|
| Xilinx 3000 Packages
|
|       %NAME part #combinational #sequential #registers
|       %PINS #ios #clocks
|

%START_PCKG

%NAME XC3020PC68 2000 256
%PINS 58 2

%NAME XC3020PG68 2000 256
%PINS 58 2

%NAME XC3020PC84 2000 256
%PINS 64 2

%NAME XC3020PG84 2000 256
%PINS 64 2

%NAME XC3090PQ160 9000 928
%PINS 138 2

%NAME XC3090CB164 9000 928
%PINS 142 2

%NAME XC3090PG175 9000 928
%PINS 144 2

%NAME XC3090PQ208 9000 928
%PINS 144 2

%END
```

|*** I/O PADS

|----------------------------------------------------
|
| Primative level declarations
|
|       %GATE name #combinational #sequential #flops
|       %INPUTS name name...
|       %OUTPUTS name name...
|       %BIS name name...
|       %TRIS name name.
|

%START_CELL

%GATE AND2 %CELL 2 0
%INPUTS 1 2
%OUTPUTS O

%GATE AND2B1 %CELL 2 0
%INPUTS 1 2
%OUTPUTS O

%GATE AND2B2 %CELL 2 0
%INPUTS 1 2
%OUTPUTS O

%GATE AND3 %CELL 2 0
%INPUTS 1 2 3
%OUTPUTS O

%GATE BUF %CELL 0 0
%INPUTS I
%OUTPUTS O

%GATE TBUF %CELL 0 0
%INPUTS I
%TRI_EN T
%TRI O

|*** FLIP FLOPS - 1

%GATE DFF %CELL 0 1
%INPUTS D CE C RD

```
%GATE OBUFZ %PAD_TRI 0 0
%PAD_PIN O
%INPUTS I
%TRI O
%TRI_EN T III *** PORTS ***

%GATE IPAD %PORT_IN 0 0
%INPUTS IPAD

%GATE OPAD %PORT_OUT 0 0
%INPUTS OPAD

%GATE BPAD %PORT_BI 0 0
%INPUTS BPAD

%GATE UPAD %PORT_BI 0 0
%INPUTS UPAD

%END
```

We claim:

1. A method of altering logic in a design of an electronic circuit generated through computerized circuit design tools, said electronic circuit having an inner array of logic surrounded by an outer ring of pads and ports, said method comprising the steps of:

recognizing a logic pattern comprised of one or more logic elements in said inner array of logic;

removing logic elements represented by said recognized logic pattern from said inner array of logic;

replacing said removed logic elements with logic elements arranged in a pad located in said outer ring.

2. The method of altering logic in a computer generated electronic circuit design of claim 1 wherein said steps of recognizing, removing and replacing are repeated for a plurality of patterns of logic elements in said inner array of logic.

3. The method of altering logic in a computer generated electronic circuit design of claim 1 wherein said step of recognizing a logic pattern comprises the steps of:

accessing a technology file which contains at least one pattern of logic elements, said technology file also containing mapping information for use in replacing patterns of logic elements;

searching said inner array of logic of said computer generated electronic circuit design for the first element of a pattern of logic elements identified in said technology file;

if said first element of a pattern is found, searching said inner array of logic of said computer generated electronic circuit design for each succeeding logic element of said pattern until all logic elements of said pattern are identified within said inner array of logic or until it is determined that a logic element of said pattern is not present in a desired location in said inner array of logic being searched;

identifying patterns in said circuit design, said identified patterns being patterns in which all logic elements of said pattern are located in said inner array of logic.

4. The method of altering logic in a computer generated electronic circuit design of claim 1 wherein said step of removing logic elements comprises the steps of:

identifying each net connected to an input and output of said recognized logic pattern;

tagging each logic element of said recognized logic pattern as a deleted element.

5. The method of altering logic in a computer generated electronic circuit design of claim 1 wherein said step of replacing said removed logic elements comprises the step of:

connecting each net leading into or out of a recognized logic pattern being replaced to a preassigned input or output in said pad being used to replace the logic element of said recognized logic pattern.

6. The method of altering logic in a computer generated electronic circuit, design of claim 1 wherein prior to performing said step of recognizing a logic pattern said method further comprises the steps of:

searching said circuit design for at least two tri-state logic elements having outputs that are wired together;

connecting a tri-state enable net leading to the tri-state enable input of each of said at least two tri-state logic elements to one or more gates of a type specified in a technology file, said one or more gates being added to said circuit design, all of said gates having a single output net;

connecting said single output net to a tri-state enable input of a tri-state pad.

7. The method of altering logic in a computer generated electronic circuit design of claim 1 further comprising the step of:

determining nets in a recognized logic pattern which lead from logic elements;

adding pads to said circuit design for each net in a recognized logic pattern that is not a net leading from a logic element that is being replaced.

8. The method of altering logic in a computer generated electronic circuit design of claim 7 wherein said step of adding pads comprises:

determining the type of terminal to which each of said nets in a recognized logic pattern is connected;

searching a technology file for a pad corresponding to said type of terminal;

if a pad corresponding to said type of terminal is found in said technology file, writing said pad into said electronic circuit design and writing connections to said pads into said electronic circuit design.

9. A system for altering logic in a design of an electronic circuit generated through computerized circuit design tools, said electronic circuit having an inner array of logic surrounded by an outer ring of pads and ports, said system comprising:

a processor for (a) recognizing a logic pattern comprised of one or more logic elements in said inner array of logic;

(b) removing logic elements represented by said recognized logic pattern from said inner array of logic;

(c) replacing said removed logic elements with logic elements in a pad located in said outer ring.

10. A system for altering logic in a computer generated electronic circuit design of claim 9 wherein said system further comprises:

a memory device for storing a technology file containing at least one pattern of logic elements, said at least one pattern being configurable in a pad, said memory device also storing mapping information for use in replacing logic elements corresponding to logic elements in a pattern stored in said technology file;

and wherein said processor (a) accesses said technology file to fetch said at least one pattern of logic elements;

(b) searches said inner array of logic of said computer generated electronic circuit design for the first element of each pattern of logic elements accessed from said technology file;

(c) searches said inner array of logic of said computer generated electronic circuit design for each succeeding logic element of said pattern if said first element of said pattern is found, until all logic elements of said pattern are identified within said inner array of logic or until it is determined that a logic element of said pattern is not present in a desired location in said inner array of logic being searched; and (d) identifies patterns in said circuit design, said identified patterns being patterns in which all logic elements of said pattern are located in said inner array of logic.

* * * * *